(12) United States Patent
Kluge et al.

(10) Patent No.: US 7,224,949 B2
(45) Date of Patent: May 29, 2007

(54) ESD PROTECTION CIRCUIT FOR RADIO FREQUENCY INPUT/OUTPUT TERMINALS IN AN INTEGRATED CIRCUIT

(75) Inventors: Wolfram Kluge, Dresden (DE); Andreas Huschka, Dresden (DE); Uwe Hahn, Berbisdorf (DE)

(73) Assignee: Advanced Micro Devices, Inc., Sunnyvale, CA (US)

(*) Notice: Subject to any disclaimer, the term of this patent is extended or adjusted under 35 U.S.C. 154(b) by 413 days.

(21) Appl. No.: 10/284,645

(22) Filed: Oct. 31, 2002

(65) Prior Publication Data

US 2003/0183403 A1 Oct. 2, 2003

(30) Foreign Application Priority Data

Mar. 28, 2002 (DE) .............................. 102 14 068

(51) Int. Cl.
*H04B 1/16* (2006.01)
(52) U.S. Cl. .................. 455/217; 455/333; 455/296; 257/355; 257/288
(58) Field of Classification Search ............... 455/117, 455/333, 217, 305, 310, 343.1, 312, 334, 455/254, 298, 424, 301, 226.1, 550.1, 575.1, 455/425, 561, 292, 287, 283, 289, 290, 291, 455/295, 296, 456.5, 456.6; 330/298; 333/12, 333/23, 167, 32, 247, 260; 361/91.7, 56, 361/57, 111, 113, 118, 119, 120, 115, 212, 361/91.5, 100; 174/35 R; 327/310, 324, 327/309, 311, 319, 320, 321, 326; 257/173, 257/199, 212, 603, 551, 347, 349, 504, 584, 257/586, 355, 691, 664, 723, 786, 288
See application file for complete search history.

(56) References Cited

U.S. PATENT DOCUMENTS 5,122,921 A * 6/1992 Koss .......................... 361/111

(Continued)

FOREIGN PATENT DOCUMENTS

DE 3213437 4/1982

(Continued)

OTHER PUBLICATIONS

"Elektronik, Frundlagen, Prinzipien, Zusammenhange", Horst Volz, 2 nd edition, 1979, Akademie-Verlag, Berlin.

*Primary Examiner*—Edward F. Urban
*Assistant Examiner*—Charles Chow
(74) *Attorney, Agent, or Firm*—Meyertons Hood Kivlin Kowert & Goetzel, P.C.; B. Noël Kivlin (57) ABSTRACT

An integrated circuit comprises an ESD protection circuit including an inductor coupled between an input terminal and a ground terminal at which an RF signal is applied. The inductor is designed so as to provide a sufficient current capability required in typical ESD events. Moreover, the inductance of the inductor is selected to define, in combination with any parasitic capacitance present, a resonance tank with a resonant frequency that is matched to the RF signal. Accordingly, the operating frequency of the integrated circuit is not limited by the ESD protection circuit. In a further embodiment, an output terminal is ESD protected by an inductor that is coupled to an auxiliary voltage serving to bias an output transistor. Moreover, clamping elements, such as diodes, are provided between the auxiliary voltage and the supply voltage and between the auxiliary voltage and ground potential.

34 Claims, 3 Drawing Sheets

U.S. PATENT DOCUMENTS

| | | | |
|---|---|---|---|
| 6,107,684 A * | 8/2000 | Busking et al. | 257/725 |
| 6,327,126 B1 * | 12/2001 | Miller et al. | 361/56 |
| 6,426,665 B2 * | 7/2002 | Morishita | 327/310 |
| 6,459,343 B1 * | 10/2002 | Miller | 333/32 |
| 6,509,779 B2 * | 1/2003 | Yue et al. | 327/310 |
| 6,861,680 B2 * | 3/2005 | Ker et al. | 257/199 |
| 6,873,505 B2 | 3/2005 | Chen et al. | |
| 6,876,529 B2 | 4/2005 | Li | |
| 6,885,534 B2 | 4/2005 | Ker et al. | |
| 6,919,602 B2 | 7/2005 | Lin et al. | |
| 6,924,963 B2 | 8/2005 | Young et al. | |
| 6,927,957 B1 | 8/2005 | Bakulin et al. | |
| 2002/0064007 A1 * | 5/2002 | Chang et al. | 361/56 |
| 2003/0058591 A1 * | 3/2003 | Johnson | 361/56 |

FOREIGN PATENT DOCUMENTS

| | | |
|---|---|---|
| DE | 4024480 | 8/1990 |
| DE | 19718945 | 5/1997 |
| EP | 1178500 | 7/2001 |
| FR | 2813439 | 8/2000 |

* cited by examiner

ESD PROTECTION CIRCUIT FOR RADIO FREQUENCY INPUT/OUTPUT TERMINALS IN AN INTEGRATED CIRCUIT

FIELD OF THE NEW INVENTION

The present invention generally relates to the field of integrated circuits having an internal circuitry for receiving and/or outputting radio frequency signals, wherein a protection circuit is provided to minimise the risk of damage due to electrostatic discharge (ESD) events.

DESCRIPTION OF THE RELATED ART

In modern integrated circuits usually a huge number of individual circuit elements, such as field effect transistors, capacitors, resistors and the like are formed on a small substrate area so as to provide for the required functionality of the circuitry. Typically, a number of contact pads are provided, which in turn, are electrically connected to respective terminals, also referred to as pins, to allow the circuitry to communicate with the environment. As feature sizes of the circuit elements are steadily shrinking to increase package density and enhance the performance of the integrated circuit, the ability for withstanding an externally applied over voltage to any of the pins of the integrated circuit decreases significantly. One reason for this resides in the fact that decreasing feature sizes of field effect transistors, i.e. reducing the channel length of the field effect transistor, typically requires to also scale down the thickness of the insulation layer separating the gate electrode from the channel region. Any over voltage supplied to a thin gate insulation layer, however, will lead to defects in the gate insulation layer, resulting in a reduced reliability, or may even completely destroy the elements, possibly resulting in a complete failure of the integrated circuit.

One major source of such over voltages are so-called electrostatic discharge (ESD) events, wherein an object carrying charges is brought into contact with some of the pins of the integrated circuit. For example, a person can develop very high static voltage from a few hundred to several thousand volts, merely by moving across a carpet, so that an integrated circuit may be damaged when the person contacts the integrated circuit, for example, by removing the integrated circuit from the corresponding circuit board. A corresponding over voltage caused by an ESD event may even occur during the manufacturing of the integrated circuit and may thus lead to a reduced product yield. Moreover, nowadays there is an increasing tendency to use replaceable ICs in electronic systems so that only one or more integrated circuits have to be replaced in stead of the whole circuit board in order to, for example, upgrade microprocessors and memory cards. Since the reinstallation of replacement integrated circuits is not necessarily carried out by a skilled person in an ESD-safe environment, the integrated circuits have to be provided with corresponding ESD protection. To this end, a number of protective circuits have been proposed that are typically arranged between a terminal of the integrated circuit and the internal circuit to provide a current path ensuring that the voltage applied to the internal circuit remains well below a specified critical limit. For example, in a typical ESD event caused by a charge carrying person, a voltage of several thousand volts is discharged in a time interval of about 100 ns (nanoseconds), thereby creating a current of several amperes. Thus, the ESD protection circuit must allow a current flow of at least several amperes so as to ensure that the voltage across the ESD protection circuit does not exceed the critical limit.

Figure 1:
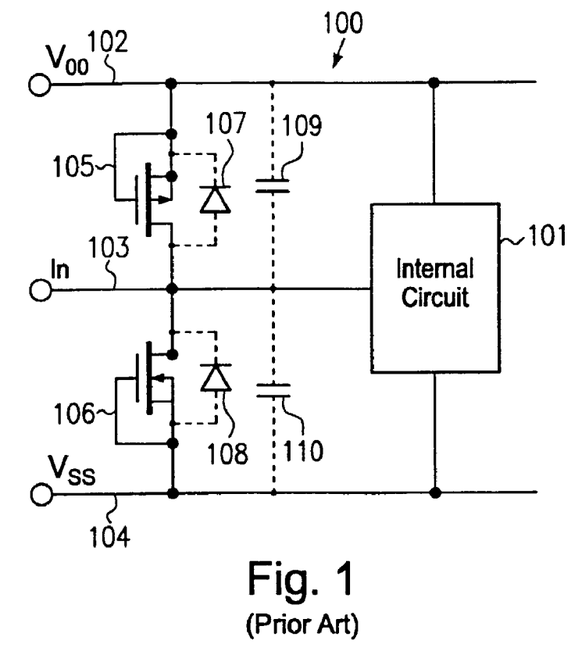
FIG. 1 shows a circuit diagram presenting a typical prior art example of an ESD protection circuit.

With reference to FIG. 1, a typical ESD protection circuit will be discussed. In FIG. 1, an integrated circuit 100 comprises an internal circuit 101 that is connected to an input terminal 103. Furthermore, terminals 102 and 104 are provided to receive the supply voltage, wherein terminal 102 receives the positive voltage supply VDD and terminal 104 receives the negative voltage supply VSS. A P-MOS transistor 105 is connected between the terminal 102 and the input terminal 103 and an N-MOS transistor 106 is connected between the input terminal 103 and the supply voltage terminal 104.

When a positive over voltage occurs on the input terminal 103, the P-MOS transistor 105 becomes conductive due to the internal inverse diode 107 to clamp the voltage of the input terminal 103 to the supply voltage VDD. Actually, the voltage on the input terminal 103 is clamped to VDD plus one forward voltage drop of the diode 107. By appropriately selecting the current capability of the P-MOS transistor 105 and for a typical rise time of the over voltage supplied to the input terminal 103, the voltage will not exceed the critical limit even during the settling time of the diode 107.

If, for example, a negative over voltage is supplied to the input terminal 103 the N-MOS transistor 106 becomes conductive, i.e. the inverse diode 108 provides a current path, so as to clamp the voltage at the input terminal 103 to the negative supply voltage VSS (plus a forward voltage drop of the diode 108).

As previously noted, the transistors 105 and 106 need to carry a current as high as several amperes and thus, the size of these transistors, has to be adapted accordingly. A large size of the transistors 105, 106, on the other hand, leads to a relatively large parasitic capacitance, as indicated by capacitors 109 and 110 so that the applicability of transistor elements as ESD protection circuit dramatically affects the high frequency characteristics of the integrated circuit 100. For example, in modern wireless communications systems, commonly integrated circuits including a large number of MOS transistors are used that are intended to operate up to several GHz (gigahertz) and hence, adequate protection of the corresponding terminals receiving or outputting any signals in this frequency range may not adequately be protected against ESD events, since the associated parasitic capacitances do not allow to form sufficiently sized protective elements without unduly degrading the performance of the integrated circuit.

In view of the above problems, there is a need for improved ESD protection for integrated circuits operating at relatively high frequencies.

SUMMARY OF THE INVENTION

Generally, the present invention is directed at a device and a method that protects an integrated circuit, which is configured to operate in a radio frequency range, from damage by electrostatic discharge events by providing a protection circuit that exhibits a frequency dependent resistance such that radio signals composed of high frequency components are only slightly attenuated, while low-frequency may effectively be shorted to substantially avoid serious over voltage at an internal circuit of the integrated circuit.

In one embodiment, an integrated semiconductor device comprises an internal circuit for processing an RF signal and an input terminal to provide the RF signal to the internal circuit. Moreover, the integrated circuit comprises a reference voltage terminal, and an inductive element provided in the integrated circuit, one end of the inductive element being connected to the input terminal and another end of the inductive element being connected to the reference voltage terminal.

According to a further embodiment, an integrated semiconductor device comprises an internal radio frequency circuit, an output terminal, a first supply voltage terminal for supplying a high supply voltage and a second supply voltage terminal for supplying a low supply voltage. Furthermore, the integrated circuit comprises an output transistor coupled with one terminal to the output terminal, an auxiliary voltage node and an inductive element coupled with one end to the output terminal and coupled with the other end to the auxiliary voltage node. Moreover, a first clamping element is provided that is coupled with one side to the auxiliary voltage node and coupled with another side to the first supply voltage terminal and a second clamping element is provided that is coupled with one side to the second supply voltage terminal and coupled with another side to the auxiliary voltage node, wherein the inductive element and one of the first and second clamping elements provide a current path upon occurrence of an over voltage at the output terminal.

In yet another embodiment a method of reducing the risk of damage caused by an electrostatic discharge event in an integrated circuit having an input terminal and a reference terminal for receiving a radio frequency signal to be provided to an internal circuit is provided. The method comprises providing an ESD protection circuit between the input terminal and the reference terminal such that the ESD protection circuit exhibits a high resistivity at a predefined frequency range including the frequency of the RF signal and providing a low resistivity at frequencies below the specified frequency range.

In a further embodiment, a method of reducing the risk of damage caused by an electrostatic discharge event in an integrated circuit having an output terminal and a reference terminal for outputting an RF signal supplied by an internal circuit is provided. The method comprises providing an output transistor, one terminal of which is connected to the output terminal. Moreover, an inductive element is provided, one end of which is coupled to the output terminal, the other end of which is coupled to an auxiliary voltage node. The method further includes providing first and second clamping elements between the auxiliary voltage node and high supply voltage line and the auxiliary voltage node and a low supplied voltage line, respectively, so that upon occurrence of an over voltage at the output terminal, the output terminal is clamped to the high supply voltage line and the low supply voltage line, respectively, via the inductive element and one of the first and second clamping elements.

BRIEF DESCRIPTION OF THE DRAWINGS

Further advantages, objects and embodiments of the present invention are defined in the appended claims and will become more apparent with the following detailed description when taken with reference to the accompanying drawings, in which:

FIG. 2b schematically shows the layout of a portion of the inductor based circuit of FIG. 2a;

DETAILED DESCRIPTION

It is to be noted that although the present invention is described with reference to the embodiments as illustrated in the following detailed description and in the accompanying drawings, the detailed description, as well as the drawings, are not intended to limit the present invention to the particular embodiments disclosed therein, but rather, the described embodiments merely exemplify the various aspects of the present invention, the scope of which is defined by the appended claims.

Figure 2A:
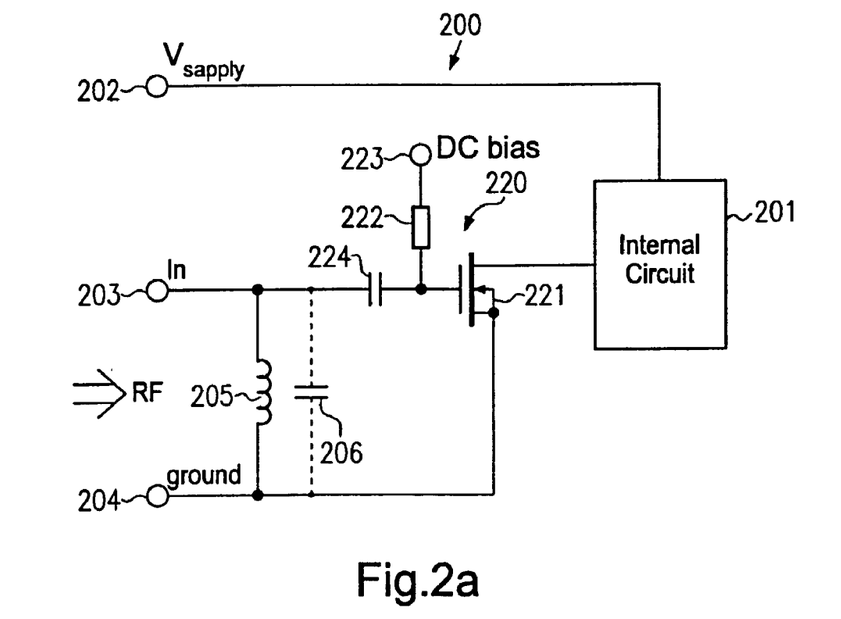
FIG. 2a depicts an illustrative embodiment relating to an inductor based circuit for protecting a radio frequency input terminal.
Figure 2B:
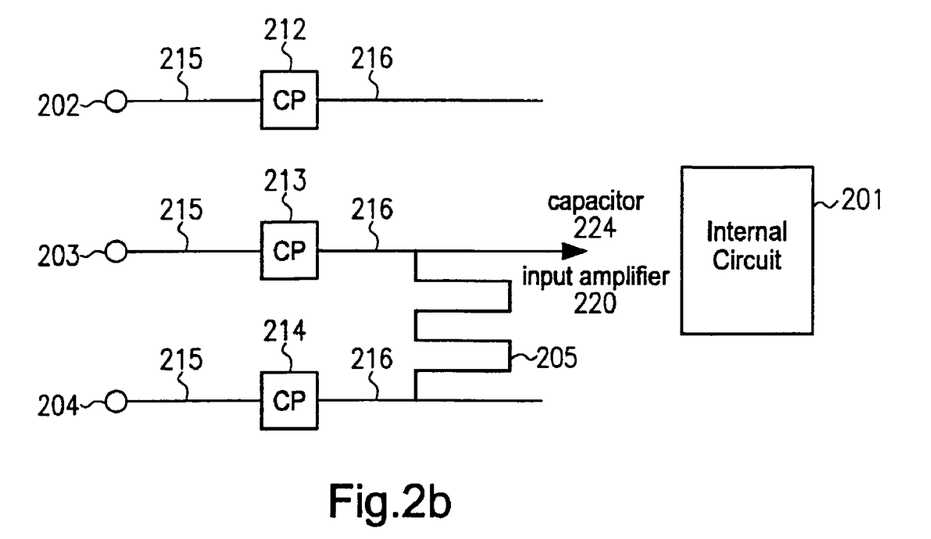
Figure 3:
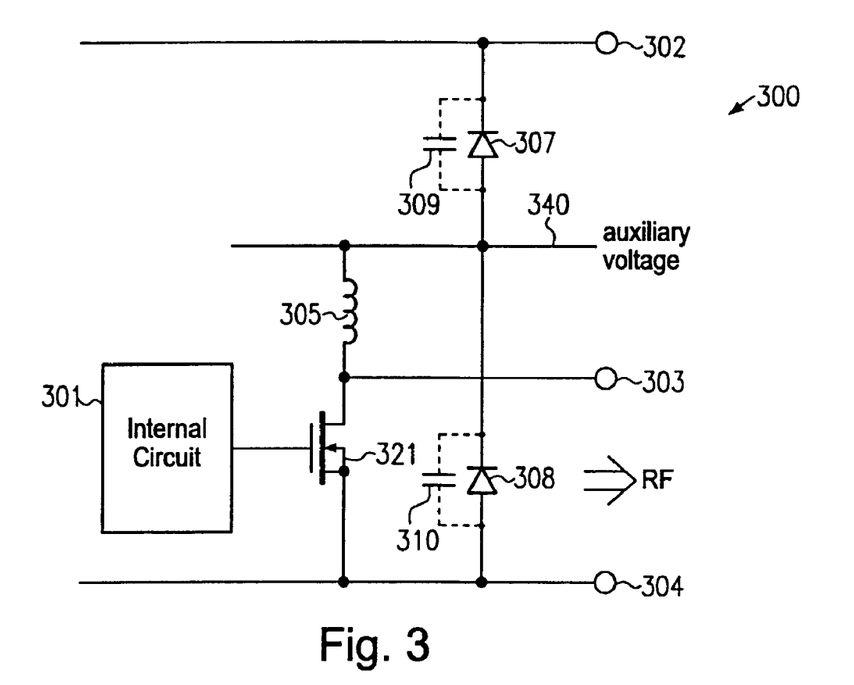
FIG. 3 shows a circuit diagram demonstrating a circuitry for protecting an output terminal according to a further illustrative embodiment.
Figure 4:
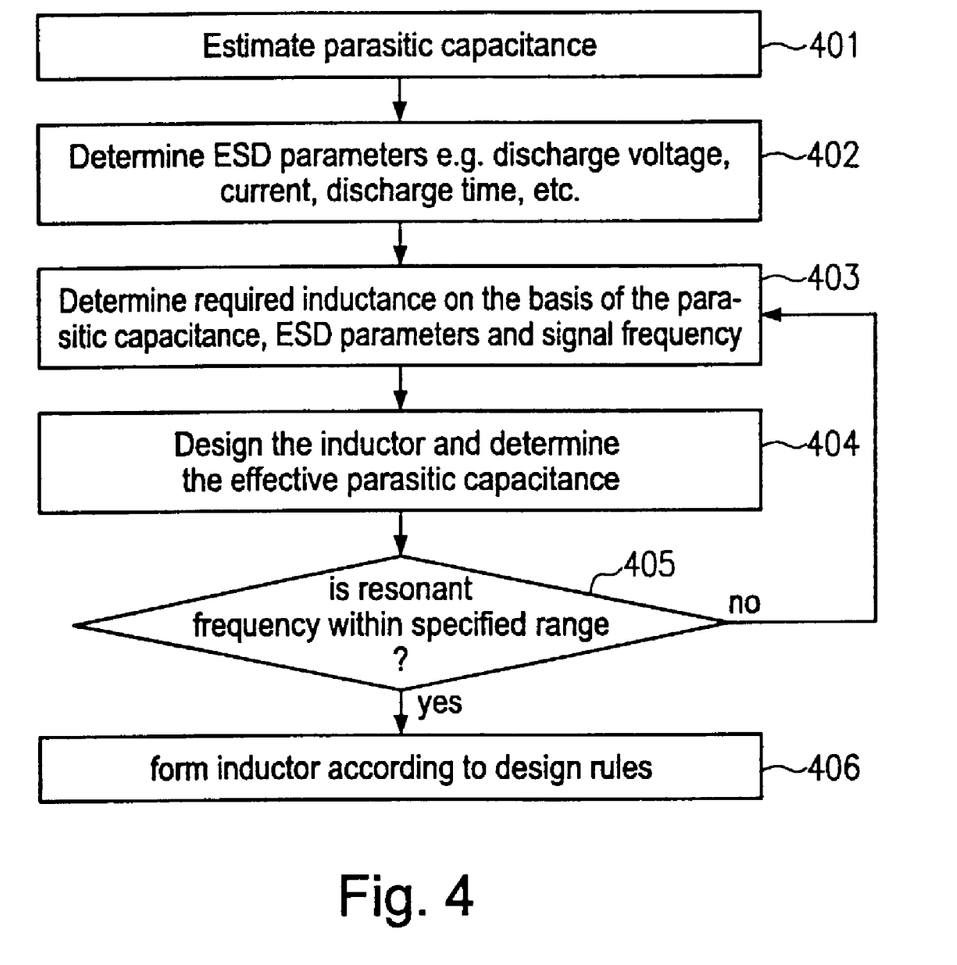
FIG. 4 shows a flow chart illustrating steps for forming a semiconductor device having an improved ESD protection pursuant to one illustrative embodiment.

With reference to FIGS. 2 to 4, illustrative embodiments will now be described, which are directed at the problem of reducing the risk of damage caused by any electrostatic discharge events occurring on input and/or output terminals of integrated circuits. Also, in the following detailed description, reference will be made to ESD events involving a voltage of the order of 2000-3000 volts at a rise time of about 100 ns, with a discharge current of several amperes. These parameters correspond to the so-called human body model with a capacitance of about 150 pF (picoFarad) with a charge of about 0.5C (Coloumb), it will, however, be appreciated that the illustrative embodiments described herein as well as the present invention with its scope defined in the appended claims may readily be adapted to other environmental conditions, i.e. higher or lower electrostatic voltages, higher or lower discharge times and the like. Moreover, in the following detailed description, as well as in the claims, the term "radio frequency" signal or "RF" signal will be used for any signals that may preferably be used in wireless communication systems and thus, the term RF signal is to include all types of signals in a frequency range from several hundred kilohertz to several GHz. Furthermore, the term "MOS transistor" is to be understood as any type of field effect transistor having an insulated gate electrode irrespective whether the gate insulation layer is an oxide layer or any other suitable material.

FIG. 2a schematically shows a circuit diagram of a portion of an integrated circuit 200, which may represent any type of integrated circuit adapted to process RF signals, such as an integrated circuit used in portable wireless communication devices. The integrated circuit 200 comprises an internal circuit 201 including a plurality of active and passive elements, such as MOS transistors, capacitors, resistors and the like. For convenience, the internal structure of the internal circuit 201 is not shown in FIG. 2a. Moreover, the integrated circuit 200 at least comprises an input terminal 203 and a ground terminal 204 between which an RF signal is supplied to the integrated circuit 200, and a supply voltage terminal 202. The integrated circuit 200 further comprises an input amplifier 220, which in this illustrative embodiment is represented by a single N-MOS transistor 221, the gate electrode of which is biased by a DC voltage source 223 via a resistor 222. In other embodiments, the input amplifier 220 may comprise a more complex structure and may comprise two or more amplifier stages instead of the single N-MOS transistor 221. In any case, a voltage sensitive insulation layer may be present within the input signal path, irrespective whether this layer is a gate insulation layer or any other dielectric layer, which may not experience an over voltage of a certain maximum limit. This maximum voltage limit depends on the technology used for forming the MOS transistor such as the N-MOS transistor 221, wherein, generally, the rule applies that more sophisticated semiconductor elements will exhibit a higher sensitivity to any over voltage supplied thereto. For example, a MOS transistor formed according to a 0.25 micrometer C-MOS technology, that is, the gate length of the MOS transistor is designed to 0.25 μm, may comprise a gate insulation layer that withstands a voltage not higher than about 6 volts.

A coupling capacitor 224 is connected with one electrode thereof to the gate of the MOS transistor 221, whereas the other electrode of the coupling capacitor 224 is coupled to the input terminal 203. The coupling capacitor 224 may be formed as a vertical trench capacitor and usually exhibits a dielectric breakdown voltage that significantly exceeds the dielectric breakdown voltage of the gate electrode of the N-MOS transistor 221. In one particular embodiment, the coupling capacitor 224 has a dielectric breakdown voltage of 15 volts and more. An inductive element represented by an inductor 205 is connected with one end to the input terminal 203 and with the other end to the ground terminal 204. The inductor 204 may preferably be formed in close proximity to the corresponding contact pads (will be described with reference to FIG. 2b) of the integrated circuit 200 that are connected to the input terminal 203 and ground terminal 204, respectively. As will be appreciated, several techniques are available for physically connecting any contact pads in the die area, on which the integrated circuit 200 is formed, to the terminals, e.g. pins, of the package of the integrated circuit 200, such as flip chip bonding, wire bonding, tape automated bonding and the like.

FIG. 2b schematically shows a portion of the layout of the integrated circuit 200. In FIG. 2b, the terminals 202, 203 and 204, such as pins of an IC package, are connected to respective contact pads 212, 213 and 214, which are also labelled as CP in the drawing, by respective conductive lines 215, such as gold wires, when a wire bonding technique is employed. The contact pads 212, 213 and 214 in turn are connected to respective metal lines 216 that provide for electrical contact to the respective chip areas such as the internal circuit 201. It should be noted that the circuit layout of the integrated circuit 200 in FIG. 2b is oversimplified and it will be appreciated that in reality the metal lines 216 may be provided in a more complex structure and may be provided as multi-layered metal lines.

As shown in FIG. 2b, the inductor 205 may be provided as a metal line, provided in a single metallization layer or in multiple metallization layers and comprising one or more foldings so as to achieve the required inductance as will be detailed below. Moreover, the metal lines forming the inductor 205 are designed such that the required current capability is guaranteed. In one embodiment, the inductor 205 is configured to be able to repeatedly conduct a current of at least one ampere, and more preferably, of at least 3 amperes. In one embodiment (not shown), the inductor 205 may comprise one or more windings.

Again referring to FIG. 2a, a parasitic capacitance 206 is shown in parallel to the inductor 205, wherein the parasitic capacitance 206 is to represent the sum of parasitic capacitances present in the signal path of the RF signal supplied to the input terminal 203 and the ground terminal 204. For example, as previously noted, any MOS transistor has, depending on the size and design, a certain capacitance. Moreover, depending on the design, the lines 215 and 216 (see FIG. 2b), as well as the inductor 205, introduce a parasitic capacitance that an input signal will "see" when applied to the terminals 203 and 204. In one particular embodiment, the inductance of inductor 205 is selected so as to form a resonance tank with the parasitic capacitance 206 with a resonant frequency lying in the range of the frequencies included in the input signals supplied to the terminals 203 and 204. One illustrative method for obtaining the required inductance and for forming the inductor 205 will be described with reference to FIG. 4.

During normal operation of the integrated circuit 200, an RF signal is supplied to the terminals 203 and 204, wherein, preferably, the resonant frequency of the resonance tank 205, 206 is matched to the input frequency range so that the RF signal is coupled via the coupling capacitor 224 to the gate of N-MOS transistor 221 without essential losses. Contrary to the prior art approach as, for example, illustrated in FIG. 1, using the inductor 205 as a resonant element of a resonance tank for the frequency range of the RF input signal and as a low-ohmic conductor for other frequencies, whereby advantageously the parasitic capacitance is positively used to define the resonant frequency, consequently allows the provision of an ESD protection circuit that does substantially not impose a restriction with respect to the maximum processable frequency.

If, on the other hand, an over voltage is applied to the input terminal 203, for example by an ESD event, the inductor 205 provides a current path to short the input terminal 203 and the ground terminal 204 so that the voltage across the inductor 205 remains well below a critical limit that may cause any damage in the subsequent circuit elements, such as the coupling capacitor 224 and the N-MOS transistor 221. Even if the ESD event includes relatively high frequency components, should the time constant associated with the ESD event be relatively small, yet longer than the inverse frequency of the RF signal, the coupling capacitor 224 allows tolerance of a relatively high voltage across the inductor 205, for example 15 volts or more depending on the dielectric breakdown voltage, and thus ensures that any sensitive MOS transistors are effectively protected.

In one particular embodiment, the integrated circuit 200 is designed for processing RF signals of the order of GHz, so that the inverse frequency, that is the period of the RF signal as of the order of 1 ns whereas the rise time of a typical ESD event is of the order of 100 ns so that the resonance tank 205, 206 will be an effective short circuit for the slow ESD event, but will substantially not affect the input RF signal, when the resonant frequency is matched to the frequency range of the RF signal.

With reference to FIG. 3, further illustrative embodiments will now be described.

In FIG. 3 an integrated circuit 300 comprises an internal circuit 301 that is coupled to an output stage 321 provided in this embodiment as an N-MOS transistor. The source of the N-MOS transistor 321 is coupled to an output terminal 303. However, the output stage 321 may comprise additional components depending on design requirements so that two or more transistor elements as well as additional passive components may be included in the output stage 321. Moreover, a supply voltage terminal 302 and a ground terminal 304 are provided. A node 340 for an auxiliary voltage is coupled to the supply voltage terminal 302 by a first clamping element such as diode 307. Furthermore, the node 340 is coupled to the ground terminal 304 by a second clamping element such as diode 308. The parasitic capacitances of the diodes 307, 308 are indicated by reference numerals 309, 310 respectively. The first and second clamping elements may, according to further embodiments, include, alternatively or additionally, other elements such as a P-MOS transistor, an N-MOS transistor, Zener diodes, capacitors, resistors, and the like. An inductor 305 is coupled with its one end to the node 340 and with its other end to the output terminal 303. Regarding the layout of the terminals 302, 303, 304 and corresponding contact pads as well as metal lines, the same criteria as pointed out above with reference to FIGS. 2a and 2b also apply in this case.

It should be noted that the node 340 may be connected to the supply voltage terminal 302 so that the auxiliary voltage corresponds to the supply voltage.

Moreover, the diodes 307, 308 are shown as being connected for a positive supply voltage. For a negative supply voltage the diodes 307, 308 may be connected inversely to what is shown in FIG. 3.

During normal operation, the integrated circuit 300 may output an RF signal at the terminals 303 and 304. The RF signal is coupled out by the N-MOS transistor 321, wherein the inductor 305 provides a DC bias voltage from node 340 to the source of the N-MOS transistor 321. In one particular embodiment, the inductance of the inductor 305 is selected so that it defines, in combination with a parasitic capacitance associated with the N-MOS transistor 321, the inductor 305 and the circuit layout and material composition of any conductive lines and contact pads, a resonant frequency that is matched to the frequency range of the RF signal.

In case of an over voltage applied to the output terminal 303, for example caused by an ESD event, a current path is provided via the inductor 305 and the diodes 307 and 308, depending on the sign of the applied over voltage. Since the diodes, which may also be provided in the form of MOS transistors, have to be of large size, the associated parasitic capacitances 309 and 310 are also relatively large. However, compared to the prior art approach of FIG. 1, these parasitic capacitances are due to the provision of the inductor 305 not integrated in the signal path and hence, do not adversely influence the output signal provided at terminals 303 and 304. Thus, the provision of the inductor 305 allows the employment of suitably sized circuit elements, such as the diodes 307, 308 and/or MOS transistors and/or Zener diodes and the like, having the required current capability for the specified ESD events without unduly restricting the operating frequency range of the integrated circuit 300.

In one embodiment, the protection schemes shown in FIGS. 2 and 3 may be combined so as to substantially protect the input and output terminals of a respective integrated circuit. Furthermore, it is to be noted that a plurality of input and output terminals may be protected by a corresponding number of protective circuits, such as those shown in FIGS. 2 and 3.

Although the illustrative embodiments described so far relate to integrated circuits that are manufactured on a common substrate, the present invention may also be applied to circuit configurations in which one or more portions of the integrated circuit are manufactured on a separate substrate. For example, in one embodiment, the internal circuit including, for example, an input amplifier may be manufactured in accordance with a typical MOS technique, whereas the inductor may be manufactured separately and combined with the internal circuit prior to packaging the combined circuitry. Such an- embodiment would be useful in applications where relatively large sized inductors are required.

With reference to FIG. 4 one illustrative process flow will now be described to determine the inductance of an inductor for protecting an integrated circuit from damage by an ESD event, such as shown in FIGS. 2 and 3.

In FIG. 4, in step 401, any parasitic capacitance of the integrated circuit to be formed is estimated. In this step, a preliminary design for the inductor and the ESD protection circuit may be introduced, including any input stage of the integrated circuit. For example, the layout of the involved circuitry, the materials used, and the like may be considered to obtain a first estimate of the resulting parasitic capacitance.

In step 402, the ESD parameters are determined to specify the type of ESD event against which protection should be insured. Typical parameters are ESD voltage, ESD time constant, magnitude of current prevailing during the ESD event and the like. For example, the integrated circuit under consideration may be designed to withstand a voltage of about 2000 V that builds up at the terminals upon contact with a charged body within 50 to 100 ns.

In step 403, the actual required inductance is determined on the basis of the parameters determined in step 402 and on the basis of the parasitic capacitance, such that for a given signal frequency range the resonant tank formed by the inductor and parasitic capacitance matches the signal frequency range.

In step 404, a corresponding inductor is designed in accordance with the required inductance and the design rules appropriate for the respective integrated circuit to be formed. That is, the inductor is designed by taking into consideration the available die area, the available process technology, the material used for forming the conductive lines and contact pads, the dielectric constant of the insulating materials to be provided between conductors, and the like. Then the resulting parasitic capacitance is determined and recorded that is introduced due to the design of the inductor.

In step 405, it is determined whether or not the resonant frequency, defined by the inductance and the parasitic capacitance, is, within certain specifications, to provide the required adaptation of the integrated circuit to a desired signal frequency range. If not, the process flow returns to step 403 to re-estimate the inductance. The steps 403, 404 and 405 may be repeated until the obtained resonant frequency is within the specified range.

Then, the process flow advances to step 406, in which the inductor is formed according to the design rules established in step 404.

Preferably, the method illustratively described with reference to FIG. 4 is carried out by simulation calculation.

Alternatively the design parameters for the inductor may be set in advance and the input circuitry and/or the output circuitry may be correspondingly be designed to obtain the required frequency response.

Further modifications and variations of the present inventions will be apparent to those skilled in the art in view of this description. Accordingly, the description is to be construed as illustrative only and is for the purpose of teaching those skilled in the art, the general manner of carrying out the present invention.

The invention claimed is:
1. An integrated circuit comprising:
an internal circuit for processing an RF signal;
an input terminal to provide the RF signal to the internal circuit;
a reference voltage terminal;
a first inductive element provided in said integrated circuit, one end of said inductive element being con- nected to the input terminal and another end of said inductive element being connected to the reference voltage terminal;

an output terminal;

an output transistor, one terminal of which is coupled to the output terminal;

a second inductive element, one end of which is coupled to the output terminal, the other end coupled to an auxiliary voltage node;

a first clamping element connected with one end to the auxiliary voltage node and connected with the other end to a supply voltage line; and a second clamping element connected with one end to the auxiliary voltage node and with the other end to a ground potential line.

2. The integrated circuit of claim 1, wherein said first inductive element is an integrated circuit element formed on the same substrate as said internal circuit.

3. The integrated circuit of claim 2, wherein said first inductive element comprises at least one of a metal line including one or more foldings and an inductor having windings.

4. The integrated circuit of claim 2, wherein said first inductive element comprises two or more metal portions formed in different metallization layers.

5. The integrated circuit of claim 1, further comprising an input stage coupled to said input terminal.

6. The integrated circuit of claim 5, wherein said input stage comprises a field effect transistor with one of its gate electrode and source terminal coupled to said input terminal.

7. The integrated circuit of claim 6, further comprising a coupling capacitor provided between said input terminal and said gate electrode.

8. The integrated circuit of claim 1, wherein the first inductive element is configured to carry a current of at least 1 ampere.

9. The integrated circuit of claim 1, wherein said first inductive element is configured to form a resonance tank with a parasitic capacitance seen by said RF signal such that a resonant frequency of the resonance tank is within a specified range.

10. The integrated circuit of claim 1, wherein said auxiliary voltage node is connected to the supply voltage line.

11. The integrated circuit of claim 1, wherein the first clamping element comprises a diode with one of the anode and the cathode coupled to the auxiliary volt-age node and the other one of the anode and the cathode coupled to the supply voltage line.

12. The integrated circuit of claim 1, wherein the second clamping element comprises a diode with one of the anode and the cathode coupled to the ground potential line and the other one of the anode and the cathode coupled to the auxiliary voltage node.

13. The integrated circuit of claim 1, wherein the first clamping element comprises a P-MOS transistor.

14. The integrated circuit of claim 1, wherein the second clamping element comprises an N-MOS transistor.

15. The integrated circuit of claim 1, wherein the second inductive element is an integrated element formed on the same substrate as said internal circuit.

16. The integrated circuit of claim 15, wherein the second inductive element comprises a metal line including one or more foldings.

17. The integrated circuit of claim 1, wherein the second inductive element includes metal portions formed on different metallization levels.

18. The integrated circuit of claim 1, wherein the second inductive element is adapted to conduct a current of at least one ampere.

19. The integrated circuit of claim 1, wherein the first and second clamping elements are configured to conduct a current of at least one ampere.

20. The integrated circuit of claim 1, wherein an inductance of the second inductive element is selected to define a resonant frequency with a parasitic capacitance introduced by the output transistor and the output terminal so that said resonant frequency is within a predefined range.

21. An integrated circuit comprising:

an internal radio frequency circuit;

an output terminal;

a first supply voltage terminal for supplying a high supply voltage;

a second supply voltage terminal for supplying a low supply voltage;

an output transistor coupled with one terminal to the output terminal;

an auxiliary voltage node;

an inductive element coupled with one end to the output terminal and coupled with the other end to the auxiliary voltage node;

a first clamping element coupled with one side to the auxiliary voltage node and coupled with another side to the first supply voltage terminal; and a second clamping element coupled with one side to the second supply volt-age terminal and coupled with another side to the auxiliary voltage node, wherein the inductive element and one of the first and second clamping elements provide a current path upon occurrence of an over voltage at the output terminal.

22. The integrated circuit of claim 21, wherein the inductive element is configured to conduct a current of at least one ampere.

23. The integrated circuit of claim 21, wherein said inductive element is formed on the same substrate as said internal RF circuit.

24. The integrated circuit of claim 23, wherein said inductive element comprises at least one of a metal line including at least one folding and an inductor having windings.

25. The integrated circuit of claim 23, wherein said inductive element includes metal lines formed on different metallization levels.

26. The integrated circuit of claim 21, wherein at least one of the first and second clamping elements comprises a diode.

27. The integrated circuit of claim 21, wherein at least one of the first and second clamping elements comprises an MOS transistor.

28. A method of reducing the risk of damage caused by an electrostatic discharge event in an integrated circuit having an input terminal and a reference terminal for receiving a radio frequency signal to be provided to an internal circuit, the method comprising: providing an ESD protection circuit between the input terminal and the reference terminal wherein said ESD protection circuit includes an inductive element provided on multiple metallization layers of the integrated circuit, one end of which is coupled to the input terminal and the other end of which is coupled to the reference terminal, wherein an inductance of said inductive element is selected so as to form a resonance tank with an estimated parasitic capacitance to define a resonant frequency that is in a frequency range of the RF signal.

29. The method of claim 28, further comprising:
estimating the parasitic capacitance, wherein the parasitic capacitance, is effective at the input terminal and the reference terminal, wherein said estimating is performed prior to providing said inductive element; and
determining the inductance of said inductive element on the basis of the estimated parasitic capacitance.

30. The method of claim 28, wherein said ESD protection circuit comprises an input transistor and a coupling capacitor, one electrode of which is connected to the gate of the input transistor and the other electrode of which is connected to the input terminal.

31. The method of claim 30, wherein the dielectric breakdown voltage of the coupling capacitor is higher than the dielectric breakdown voltage of the input transistor.

32. The method of claim 31, wherein the dielectric breakdown voltage of the coupling capacitor is 15 volts or higher.

33. A method of reducing the risk of damage caused by an electrostatic discharge event in an integrated circuit having an output terminal and a reference terminal for outputting an RF signal supplied by an internal circuit, the method comprising:
providing an output transistor, one terminal of which is connected to the out-put terminal;
providing an inductive element, one end of which is coupled to the output terminal, the other end of which is coupled to an auxiliary voltage node;
providing first and second clamping elements between the auxiliary voltage node and high supply voltage line and the auxiliary voltage node and a low supply voltage line, respectively, so that upon occurrence of an over voltage at the output terminal, the output terminal is clamped to the high supply voltage line and the low supply voltage line, respectively, via the inductive element and one of the first and second clamping elements.

34. An integrated circuit comprising:

an internal circuit for processing an RF signal, the RF signal having an input frequency range;

an input terminal to provide the RF signal to the internal circuit;

a reference voltage terminal; and an inductive element provided on multiple metallization layers in said integrated circuit, one end of said inductive element being connected to the input terminal and another end of said inductive element being connected to the reference voltage terminal, wherein said inductive element is configured to form a resonance tank with a parasitic capacitance seen by said RF signal such that a resonant frequency of the resonance tank is within the input frequency range of the RF signal.

* * * * *